United States Patent [19]
Kaminishi et al.

[11] Patent Number: 5,883,546
[45] Date of Patent: Mar. 16, 1999

[54] ARRAY DEVICE HAVING FUNCTIONAL CIRCUIT FOR A PLURALITY OF CHANNELS

[75] Inventors: Katsuji Kaminishi, Yokohama; Hiroshi Matsuyama, Kawasaki, both of Japan

[73] Assignee: Kabushiki Kaisha Toshiba, Kawasaki, Japan

[21] Appl. No.: 828,778

[22] Filed: Mar. 27, 1997

[30] Foreign Application Priority Data

Mar. 29, 1996 [JP] Japan ..................................... 8-076196
Mar. 29, 1996 [JP] Japan ..................................... 8-076197

[51] Int. Cl.⁶ ................................................. H01L 25/00
[52] U.S. Cl. ......................... 327/565; 327/530; 327/538; 327/566
[58] Field of Search ..................................... 327/108, 362, 327/415, 416, 417, 530, 535, 538, 565, 566; 345/205, 206; 361/760, 777

[56] References Cited

U.S. PATENT DOCUMENTS

| | | | |
|---|---|---|---|
| 3,978,473 | 8/1976 | Pastoriza | 340/347 DA |
| 4,967,192 | 10/1990 | Hirane et al. | 340/811 |
| 5,122,686 | 6/1992 | Robinson | 307/466 |
| 5,398,008 | 3/1995 | Nissler et al. | 332/178 |
| 5,406,312 | 4/1995 | Arimoto | 345/205 |
| 5,432,358 | 7/1995 | Nelson et al. | 257/81 |
| 5,448,208 | 9/1995 | Honjo | 327/565 |

FOREIGN PATENT DOCUMENTS 0 584 634  3/1994  European Pat. Off. .
0 678 982  10/1995  European Pat. Off. .

*Primary Examiner*—Timothy P. Callahan
*Assistant Examiner*—Jung Ho Kim
*Attorney, Agent, or Firm*—Finnegan, Henderson, Farabow, Garrett & Dunner, L.L.P.

[57] ABSTRACT

There is provided an array device including functional circuits for a plurality of channels, constant current generating circuits for the plurality of channels for generating constant currents used to drive the functional circuits, respectively, in accordance with a control signal supplied from the outside, and a wiring for supplying therethrough the constant currents from the constant current generating circuits to the functional circuits, respectively, which are formed on an integrated circuit chip, wherein the constant current generating circuits provided so as to correspond to the channels are arranged concentratedly in a specific region on the integrated circuit chip, and the wiring is comprised of a common wiring extending from one terminal provided in the vicinity of the specific region to the vicinities of the constant current generating circuits.

27 Claims, 12 Drawing Sheets

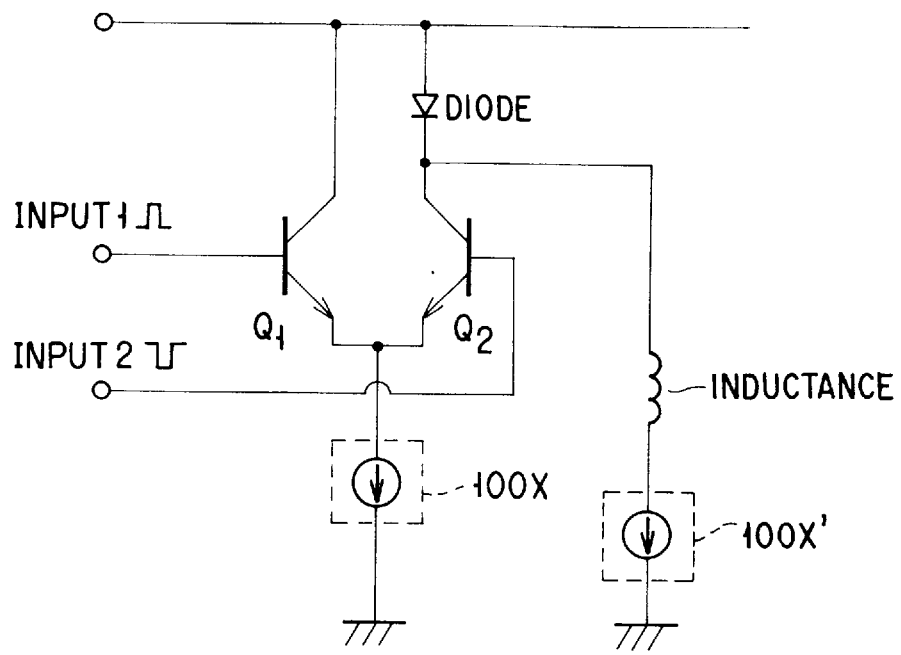
F I G. 1
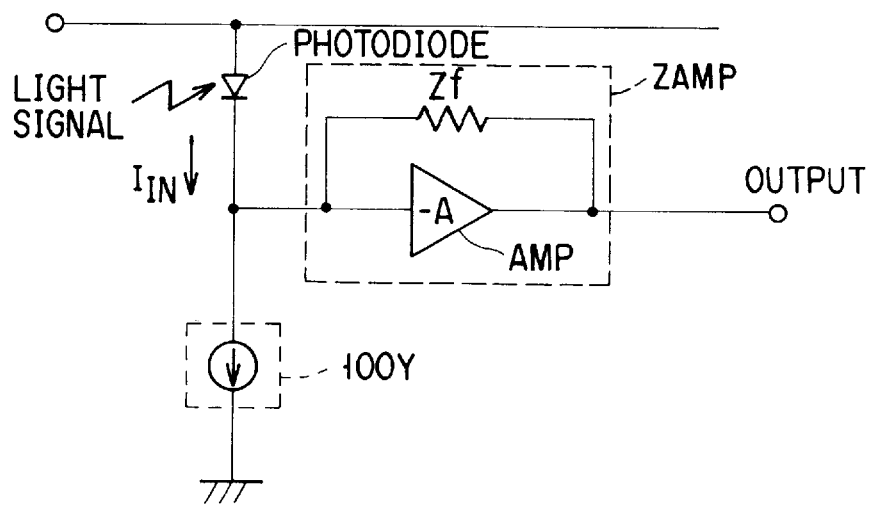
F I G. 2

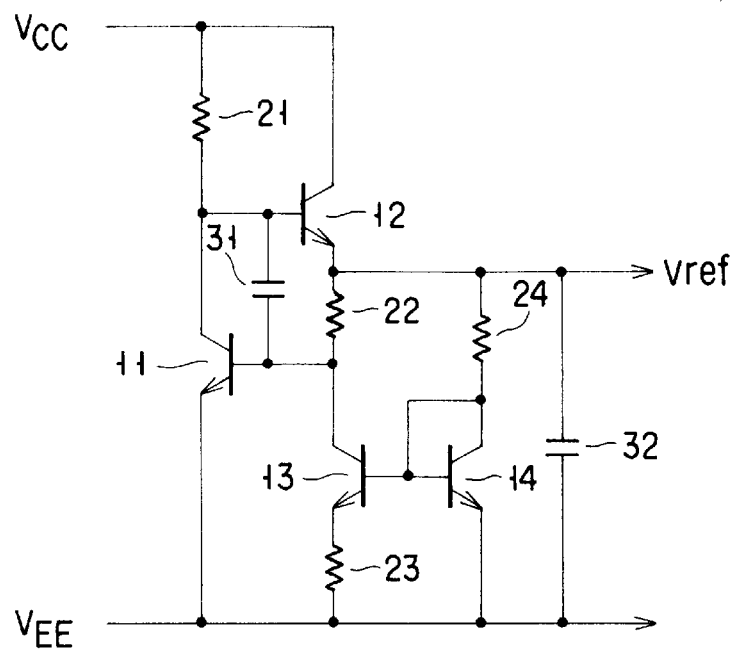
F I G. 8A
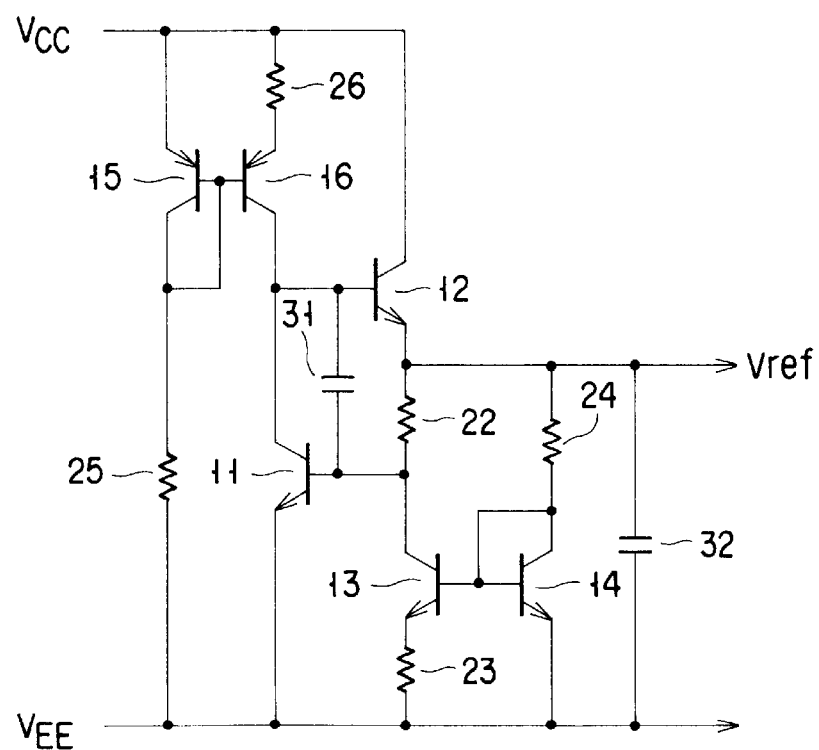
F I G. 8B

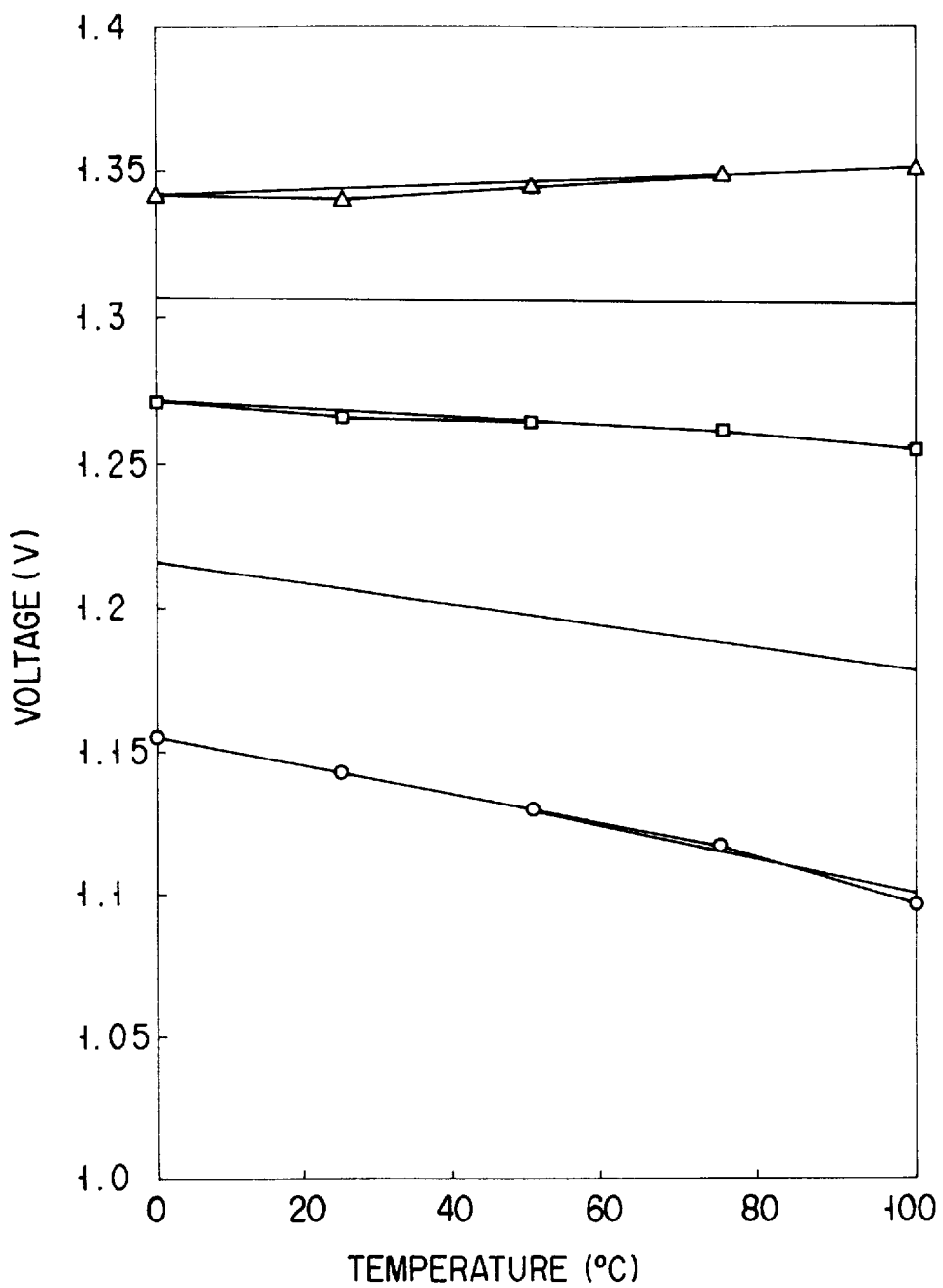
F I G. 9

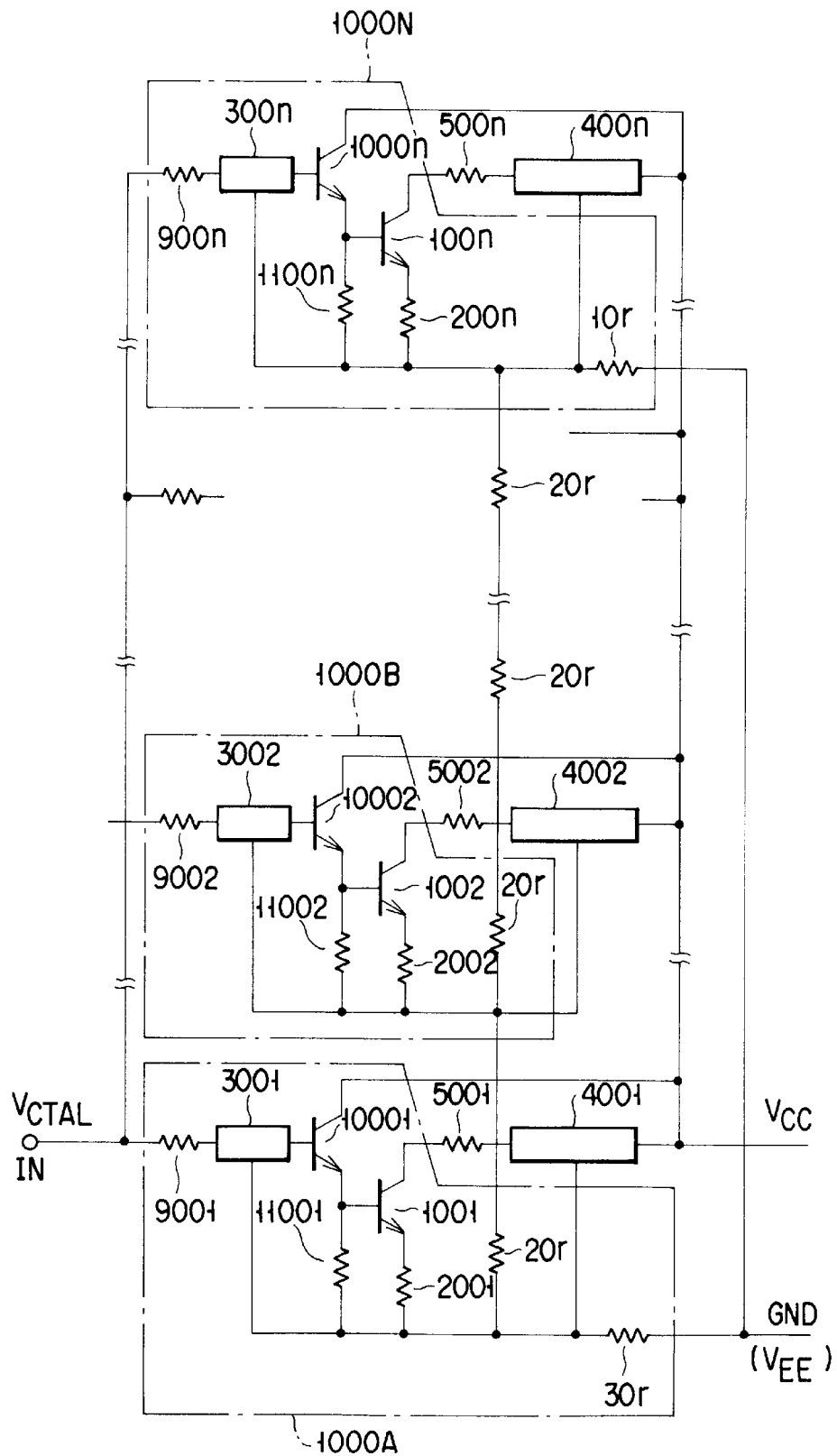
F I G. 11

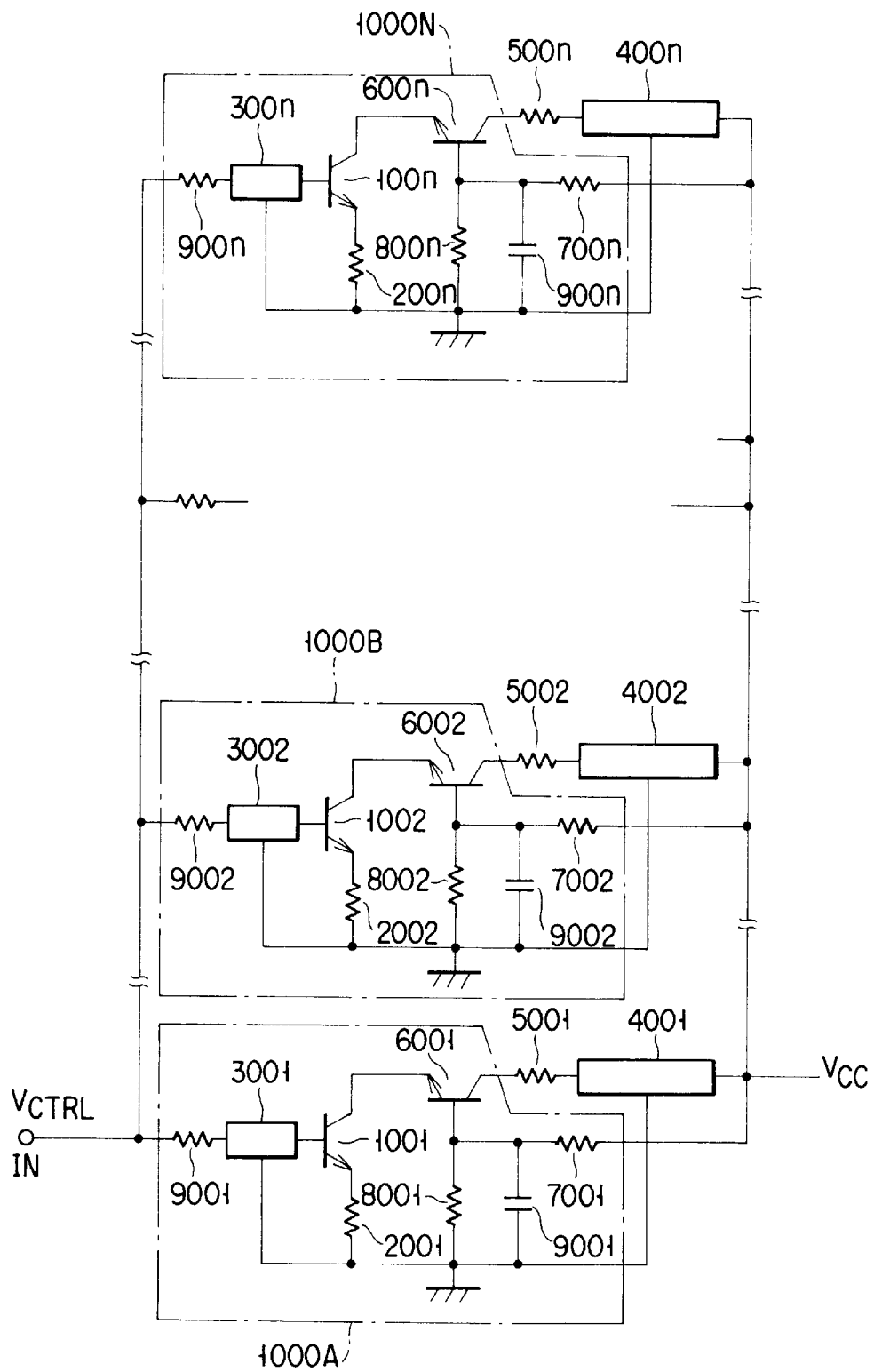
F I G. 13

ARRAY DEVICE HAVING FUNCTIONAL CIRCUIT FOR A PLURALITY OF CHANNELS

BACKGROUND OF THE INVENTION

The present invention relates in general to an array device having functional circuits for a plurality of channels such as optical receiver modules for optical interconnection or like optical receiver amodules, and more particularly to an array device including current generating circuits which are capable of supplying the same current to the functional circuits for a plurality of channels.

In recent years, as the multi-media which handles a text, a voice and an image have been developed, the request for promoting the large capacity and the high speed transmission of data in information/communication equipment is increased and as a result promotion of the high frequency and increase of the number of connections become the serious problems in the electrical interconnections within the equipment and between the equipment.

In particular, all the severe system requests for reduction of the waveform distortion and the attenuation, the EMI measures, the ground isolation, and the low power consumption become difficult to be fulfilled by the electrical interconnections.

On the other hand, the success in the optical communication technology shows that for the signal transmission of the high speed, large capacity and long distance, the procedure that an electrical signal is temporarily converted into light and the resultant light signal is transmitted through a transmission line formed of optical fibers is more advantageous than the procedure that an electrical signal is directly transmitted as it is. That is, it is shown that the light transmission in which the electro-optic and opto-electric conversion function is introduced into a system is excellent in terms of practical use.

Therefore, while it is evident that the optical communication technology becomes more and more the important technology in the future, it is a urgent necessity to develop the optical interconnection technology for solving the above-mentioned problems associated with the electrical interconnection by utilizing the various features of light.

In addition, in recent years, the performance of element devices which are essential for realizing the optical interconnection has been drastically enhanced, and also the progress in the element technology development relating to the optical and electrical mounting results in a module in which the electrical connection can be replaced with the optical interconnect being actively developed. But, in the optical interconnect module aiming at replacement from the electrical interconnect, there are many requirement problems, which are considered to be essential for the practical use, such as "to realize good convenience similar to an interface IC (integrated circuit device)", "to be small size", and "to attain both low power consumption and low cost".

In particular, in the optical transmitter module out of the multi-channel parallel interconnect modules, there is employed an array of semiconductor lasers or light emitting diodes as the electro-optic conversion devices. Each of these devices is basically a current driven device and hence requires a constant current source a current from which is controlled at a constant DC value in order to determine the bias current and a constant amplitude of a pulse driving current for extracting the device characteristics. FIG. 1 is a circuit diagram showing a transmission driver as a main portion of the optical transmitter module. In the figure, the transmission driver has transistors Q1 and Q2, and to bases thereof are inputted inputs 1 and 2, respectively. A constant current circuit 100X is connected to each of emitters of the transistors Q1 and Q2. A load DIODE is connected to a collector of the transistor Q2. The load DIODE is also connected to a constant current circuit 100X' in order to secure a high speed operation in the transmission driver.

On the other hand, FIG. 2 is a circuit diagram showing a configuration of a receiver circuit as a main portion of an optical receiver module. The incident light signal is converted into a current signal $I_{IN}$ through a photodiode and an output is obtained from a transimpedance amplifier ZAMP. A constant current generating circuit 100Y is used to compensate for a dark current of the photodiode and also to apply an offset to the input current signal.

But, the array device constituting the optical interconnect module is configured, from the circumstances in which the characteristics of the individual original constituent elements are equal to each other, in such a way as to have only to be able to supply the same current to all the constant current generating circuits of the channels.

In this connection, in the conventional design, since the high speed parallel type integrated circuit has the configuration in which the power sources and the grounding points are provided independently for every circuit in many cases, the constant current generating circuits thereof are necessarily provided independently of one another.

In such cases, since the individual unit circuits constituting the array circuit are configured in such a way as to have the independent power sources, ground and control circuits, there is the merit in which the crosstalk between the channels through direct wiring path can be in principle readily suppressed.

On the other hand, however, since not only the number of external control signals to be supplied to the circuit and the number of input/output lines containing the power source lines become enormous, but also the individual channels need to be adjusted independently of one another during use of the modules, the labor for the adjustment is complicated and also the increase in the system cost is immeasurable.

In addition thereto, it is not said as the practical means that the individual ones of a plurality of wiring lines require the fine manual adjustment on the printed card board.

Therefore, it is desirable that the power sources and the ground lines are respectively made common so that the current to be caused to flow is controlled from one common terminal.

Referring to FIG. 3, there is shown an equivalent circuit diagram, as a prior art example, of a circuit which is designed in such a way that circuits of multiple channels are controlled at the same time by one common voltage. In addition, referring to FIG. 4, there is shown the outline of an arrangement of current generating circuit blocks 100A' (301', 201', and 101') to 100N' (30n', 20n' and 10n') of channels and functional circuit blocks 401' and 402' to 40n' which are formed on an integrated circuit chip 1'.

In this example, a control signal VCTRL which has been inputted to a control signal input terminal IN is caused to flow through the positions of the current generating control blocks 100A' (301', 201' and 101') to 100N' (30n', 20n' and 10n') of the channels which are arranged in the distributed positions on the integrated circuit chip so as to generate the desired currents therefrom, and also the circuit blocks 401' and 402' to 40n' to which the constant currents are supplied from the respective current generating circuit blocks 100A' to 100N' are also distributively arranged on the integrated circuit chip. Incidentally, reference numerals 301' and 302' to 30n' designate respectively input circuits each comprised of an active circuit or a low-pass filter.

While such a layout is conventionally general, with such a layout, the ground voltage level as the reference in each of the distributed positions changes every channel due to the finite resistance which the wiring on the chip has, and hence the current generating circuits are controlled on the basis of the substantially different voltages. Then, as a result, there arises a problem that the dispersion occurs in the currents which are generated for the respective channels.

On the other hand, in the high speed optical interconnect module, the semiconductor laser is employed in order to convert an electrical signal into, a light signal. In general, it is well known that the semiconductor laser device has the property in which the characteristics thereof are sensitive to the change in the temperature, and the influence of the temperature change appears in the form of increase of the lasing threshold and reduction in the efficiency of converting the current into light. Then, both the change in the optical output and the change in the frequency bandwidth resulting from the temperature change in the oscillation threshold and the conversion efficiency influence directly the signal transmission characteristics of the optical interconnect module.

Then, therefore, in the optical communication system, in order to suppress the temperature change, a control circuit is incorporated therein to be used which is designed in such a way as to monitor the intensity of a laser output beam so as for the laser output beam to maintain the fixed average intensity at all times. However, in the field of the optical interconnect in which the requirement for the miniaturization of the module is strict, it is difficult in reality to incorporate a large scale circuit for such control in order to use it.

For this reason, conventionally, the circuit system has been adopted such that with respect to the signal which is used to control the output current of FIG. 3, the input voltage is made constant and also the output current is kept constant as much as possible. As a result, however, there arises a problem that the signal transmission characteristics of the optical interconnect module are changed in such a way that: the dynamic range of an input of the receiver circuit becomes narrow; the error rate is changed along with the change in the ambient air temperature; and the band width is changed.

As described above, in the interconnection technology, in particular, in the transmitter/receiver circuit of the parallel optical interconnect module which is connected to a plurality of optical fibers in order to carry out transmitter/receiver of the optical signal, for example, the transmission functional circuit blocks for a plurality of channels constituting the parallel optical interconnect module requires the constant current source in which the current to be supplied can be controlled from the outside, and also it is essential thereto that all the channels can be controlled at the same time by one common voltage signal. In other words, while the semiconductor laser devices each of which serves to convert the electrical signal into the optical signal are respectively employed in the transmission functional blocks, the semiconductor laser device has the feature that its output is changed along with the temperature change and the current change.

Then, the transmission functional circuit blocks are provided so as to correspond to a plurality of channels, and hence in order to make the output adjustable, the constant current source is required in which the current value of the driving signal which is supplied to each of the transmission functional circuit blocks can be controlled from the outside. In addition thereto, in order to make the output adjustment able to be readily carried out, it is essential that all the channels can be controlled simultaneously by one common voltage signal.

However, there arises a problem that the above-mentioned conditions are not essentially fulfilled in the conventional circuit and even if those conditions are fulfilled in terms of circuit configuration, the circuit does not have the characteristics essential to the optical interconnect, or even if the circuit has such characteristics, the characteristics are insufficient.

In the light of the foregoing problems associated with the prior art, it is therefore an object of the present invention to provide an array device having functional circuits for a plurality of channels which is capable of preventing the ground offset voltage from influencing thereupon.

It is another object of the present invention to provide an array device having functional circuits for a plurality of channels which is capable of relatively reducing the crosstalk between the channels of the functional circuits.

BRIEF SUMMARY OF THE INVENTION

The above-mentioned objects of the present invention are attained by the following array device having functional circuits for a plurality of channels. That is, an array device including functional circuits for a plurality of channels, constant current generating circuits for the plurality of channels for generating constant currents used to drive the functional circuits, respectively, in accordance with a control signal supplied from the outside, and a wiring for supplying therethrough the constant currents from the constant current generating circuits to the functional circuits, respectively, which are formed on an integrated circuit chip may provide that the constant current generating circuits provided so as to correspond to the channels are arranged concentratedly in a specific region on the integrated circuit chip, and the wiring is comprised of a common wiring extending from one terminal provided in the vicinity of the specific region to the vicinities of the constant current generating circuits.

In such an array device, the signal wirings which are distributed from an input terminal for the control signal to the constant current generating circuits of the respective channels are very short, and hence all the wiring resistances can be substantially ignored. As a result, since the same control signal can be supplied, all the outputs of the constant current generating circuits of the respective channels can be made substantially equal to one another. Therefore, each of the constant current generating circuits is configured in such a way as not to need to take the correction for the offset and the like into consideration in advance at all so that the current characteristics can be made equal to one another on the basis of the common control signal without the external adjustment.

In addition, the above-mentioned objects of the present invention are attained by the following array device having functional circuits for a plurality of channels. That is, an array device including functional circuits for a plurality of channels, constant current generating circuits for the plurality of channels for generating constant currents used to drive the functional circuits, respectively, in accordance with a control signal supplied from the outside, and a wiring for supplying therethrough the constant currents from the constant current generating circuits to the functional circuits, respectively, which are formed on an integrated circuit chip may provide that the constant current generating circuits provided so as to correspond to the channels are arranged on the integrated circuit chip in accordance with a regular relationship, and each of the constant current generating circuits includes a grounded-emitter transistor, an input resistor connected to a base of the transistor, and an emitter resistor connected to an emitter of the transistor, and that the wiring is comprised of a common wiring extending from one terminal to the vicinities of the constant current generating circuits.

In such an array device, the resistance value of the grounding wiring between the channels can be quantitatively grasped. As a result, the circuit configuration in which the offset is corrected in advance can be made possible, and also the characteristics of the currents which are generated from the constant current generating circuits, respectively, can be made equal to one another on the basis of the common control signal without the external adjustment.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a configuration of an example of a transmission driver for one channel for a semiconductor laser device;

FIG. 2 is a circuit diagram showing a configuration of an example of a reception circuit for one channel for a semiconductor laser device;

FIGS. 8A and 8B are respectively circuit diagrams each showing a configuration of an example of a band gap reference voltage generating circuit which is applied to the array device of the present invention;

FIG. 9 is a graphical representation showing the temperature dependency of a reference voltage in a feedforward type laser driving circuit;

FIG. 11 is a circuit diagram showing a configuration of an array device of yet another embodiment of the present invention in which there is shown an example in the case where a plurality of functional circuits are laid out in the form of one dimensional array at fixed pitches;

FIG. 13 is a circuit diagram showing a configuration of an array device of a further embodiment of the present invention.

DETAILED DESCRIPTION OF THE INVENTION

The preferred embodiments of the present invention will hereinbelow be described in detail with reference to the accompanying drawings.

Figure 5:
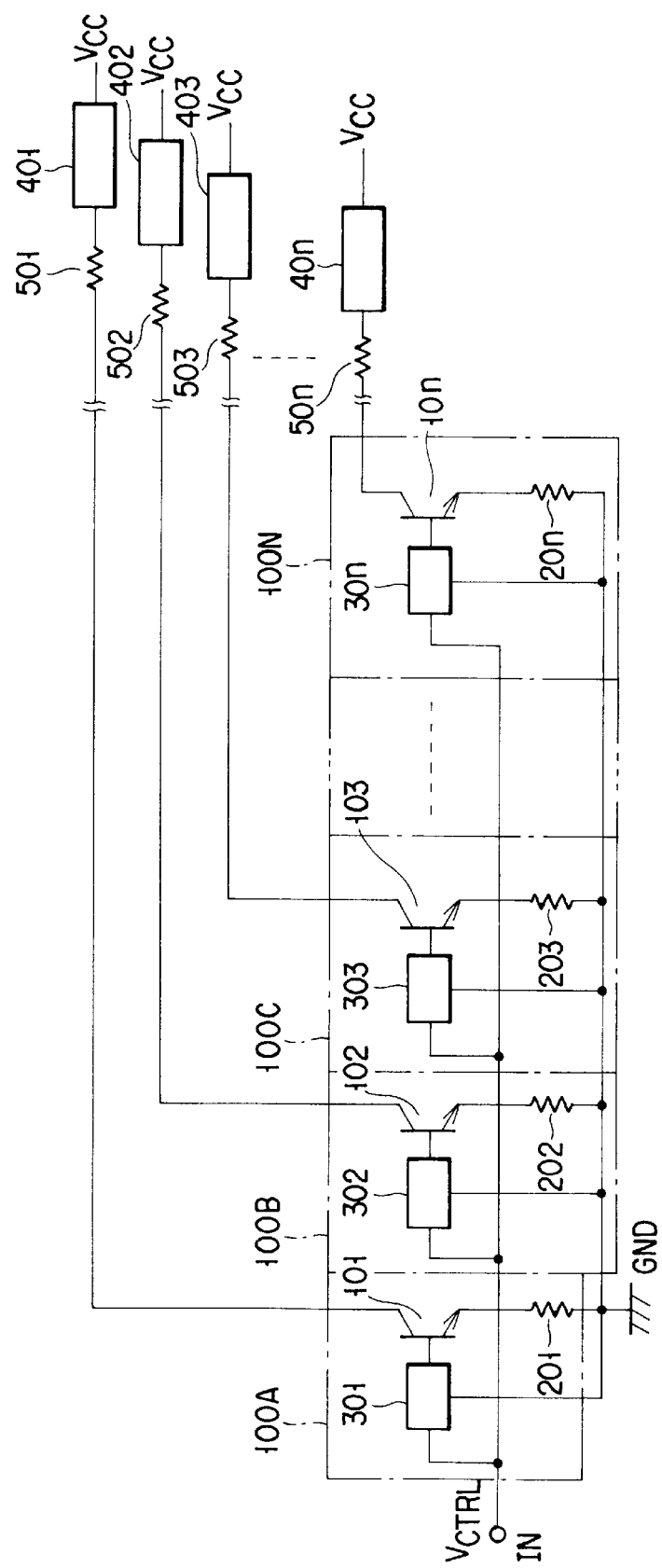
FIG. 5 is a circuit diagram showing a configuration of an array device of an embodiment of the present invention.
Figure 6:
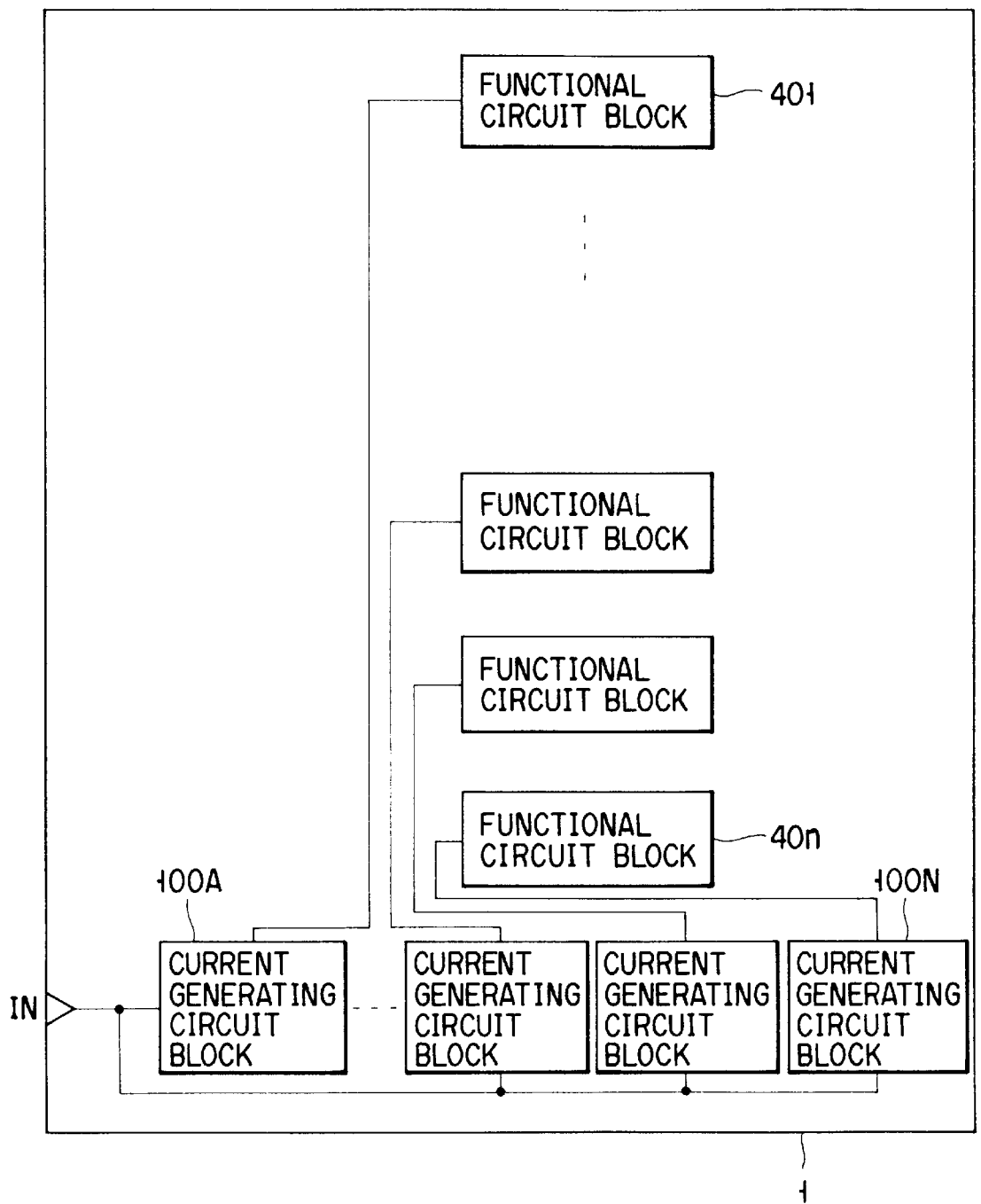
FIG. 6 is a block diagram showing an example of a layout of the array device of the embodiment shown in FIG. 5.

FIG. 5 shows a circuit of an array device of an embodiment of the present invention, and FIG. 6 shows a layout of that circuit shown in FIG. 5 on a chip. In FIG. 5, an input terminal for a control signal $V_{CTRL}$ is provided on a chip. Current generating circuit blocks 100A to 100N for a plurality of channels are also provided on the same chip. In addition, functional circuit blocks 401 to 40n for a plurality of channels are also provided on the same chip.

The current generating circuit blocks 100A to 100N for the channels receive the control signal voltage VCTRL which has been inputted through the input terminal IN and generate, in response to the control signal voltage VCTRL, current outputs each having the desired current value, and supply the currents thus generated to the functional circuit blocks 401 to 40n for the channels, respectively. The functional circuit blocks 401 to 40n for the channels carry out the predetermined operations in accordance with the currents thus supplied thereto.

Incidentally, the current generating circuit blocks 100A to 100N are provided with input circuits 301, 302 and 303 to 30n each comprised of an active circuit or a low-pass filter, respectively. In addition, the current generating circuit blocks 100A to 100N are provided with emitter resistors 201, 202 and 203 to 20n, respectively.

As shown in FIG. 6, both the current generating circuit blocks 100A to 100N for the channels and the functional circuit blocks 401 to 40n for the channels are formed on an IC chip 1. In the present embodiment, as shown in FIG. 6, the IC chip 1 is divided into an area in which the functional circuit blocks 401 to 40n are formed and an area in which the current generating circuit blocks 100A to 100N are formed. In the formation area for the functional circuit blocks, the functional circuit blocks 401 to 40n for the channels are arranged in this order, and in the formation area for the current generating circuit blocks, the current generating circuit blocks 100A to 100N for the channels are arranged in this order. The one input terminal IN is provided in the vicinity of the formation area for the current generating circuit blocks, and the control signal voltage VCTRL which has been inputted through the input terminal IN is supplied to each of the current generating circuit blocks 100A to 100N.

Then, the current generating circuit blocks 100A to 100N are collectively arranged in the formation area for the current generating circuit blocks, whereby the wiring for distributing therethrough the control signal voltage VCTRL from the common input terminal IN to the current generating circuit blocks 100A to 100N can be made short so that the wiring resistances can be substantially ignored and also the current generating circuit blocks 100A to 100N can be operated under the same circuit condition.

The current generating circuit blocks 100A to 100N are configured by employing respective transistors, and generate, in response to the inputted control signal voltage VCTRL, the currents and also supply the currents thus generated to the corresponding functional circuit blocks 401 to 40n, respectively.

In the present invention, though the control signal voltage VCTRL is distributed through the control signal wirings from the common input terminals IN to a plurality of current generating circuit blocks 100A to 100N, since the current generating circuit blocks are concentratedly arranged in one area, the electrical conditions for the current generating circuit blocks 100A to 100N are approximately the same. In addition, likewise, since the functional circuit blocks 401 to 40n are also concentratedly arranged in the other one area, the electrical conditions for the functional circuit blocks 401 to 40n are approximately the same.

Incidentally, the current generating circuit blocks 100A to 100N include grounded-emitter npn transistors 101 to 10n, respectively. Then, when the control signal voltage VCTRL is supplied to the bases of the transistors 101 to 10n, the current generating circuit blocks 100A to 100N generate, in response to the control signal voltage VCTRL, the currents and then supply the currents thus generated to the corresponding functional circuit blocks 401 to 40n.

Then, the current generating circuit blocks 100A to 100N are collectively arranged in the same area, whereby the length of the wiring can be shortened and also when distributing the current signal voltage VCTRL from the input terminal IN to the current generating circuit blocks through the wirings, the differences between the voltage drops due to the wiring resistances and the offset voltages in the ground line, to which the emitter resistors 201 to 20n are connected in the transistors 101 to 10n, corresponding to the reference ground of the integrated circuit can not occur at all.

Next, the description will hereinbelow be given with respect to the operation of the present device having such a configuration.

The array device of the present embodiment shown in FIG. 5 has the feature that the device is, as shown in FIG. 6, laid out on the IC chip 1. That is, in the case of the configuration of the conventional array device shown in FIG. 3, though one common input terminal for the control signal voltage VCTRL are provided, the constant current generating circuit blocks as the circuits for generating the constant currents, are, as shown in FIG. 4, distributively arranged on the chip 1, and hence the control signal wirings are distributed up to the constant current generating circuit blocks and the control signal voltage VCTRL is supplied to the bases of the transistors in the constant current generating circuits which are arranged away from one another.

Figure 3:
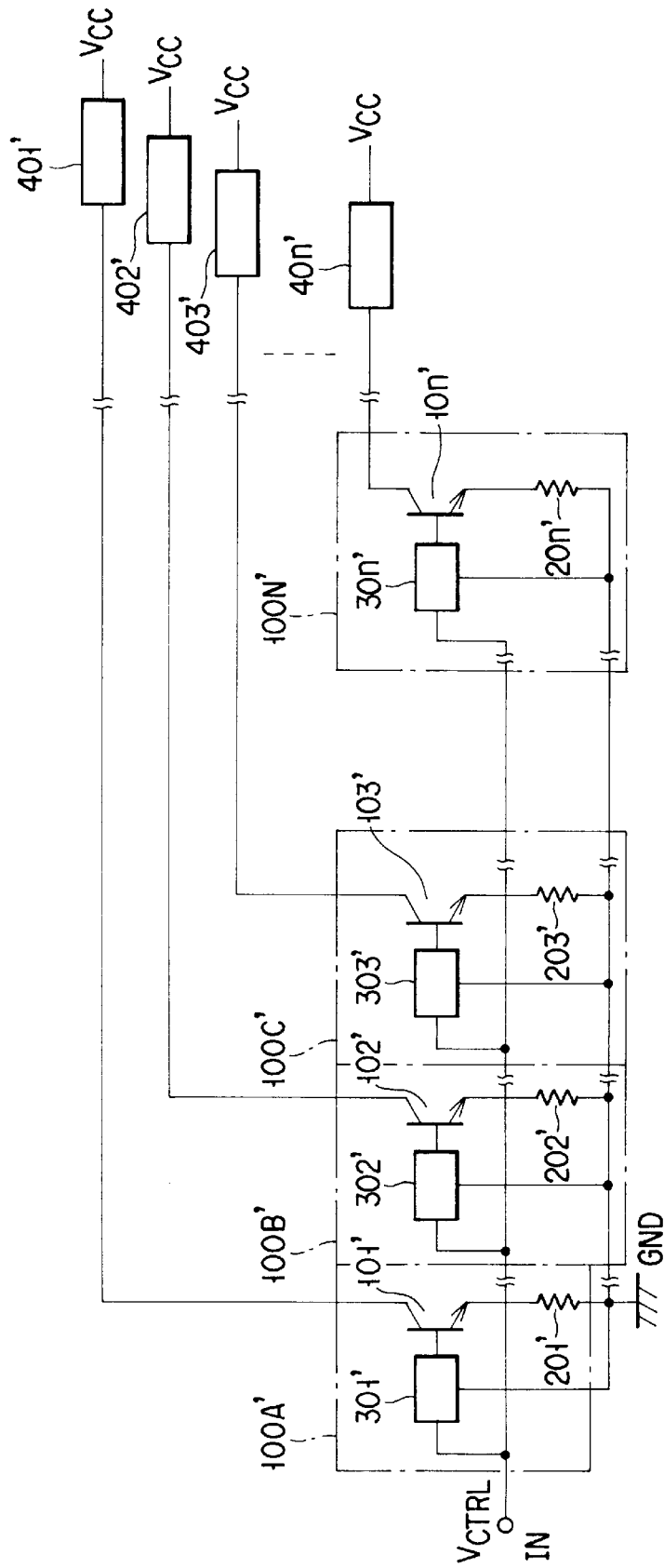
FIG. 3 is a circuit diagram showing a configuration of a conventional array device.
Figure 4:
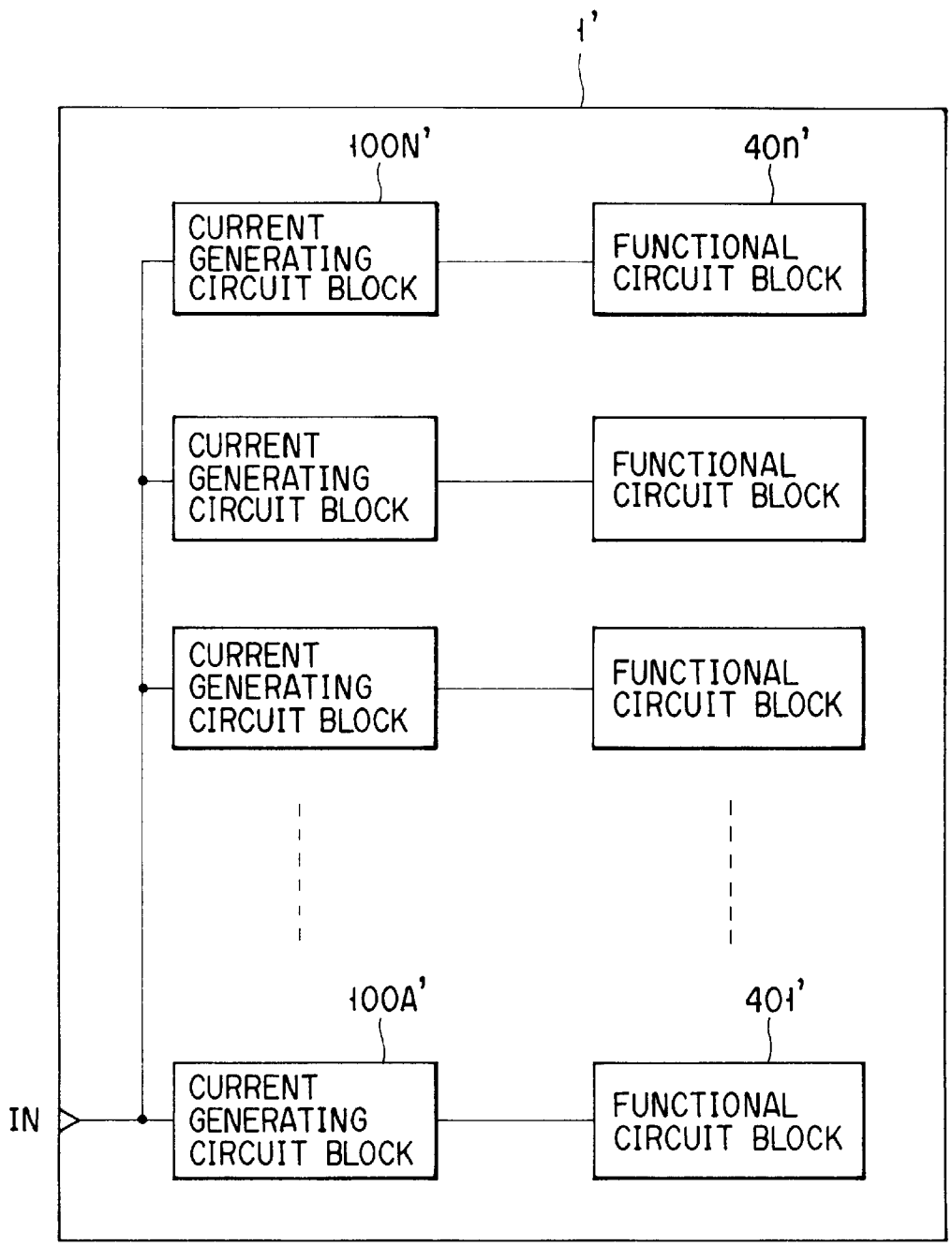
FIG. 4 is a block diagram showing an example of a layout of the conventional array device.

On the other hand, in the present invention shown in FIGS. 5 and 6, since the current generating circuit blocks of the channels are concentratedly arranged in the vicinity of the input terminal IN for the control signal voltage VCTRL, the wiring resistances between the wirings and the ground line can be disregarded as compared with the conventional configuration shown in FIG. 3 and hence the electrical common ground can be provided.

Since with respect to the collector outputs of the transistors in the constant current generating circuit blocks 100A to 100N, the output impedances are sufficiently high, the wiring impedances up to the functional circuit blocks 401 to 40n which are arranged in the area away from the constant current generating circuit blocks 100A to 100N on the chip 1 do not become a subject of discussion.

In the case where the high frequency signals are provided on the inputs of the functional circuit blocks 401 to 40n to which the collector outputs of the transistors 101 to 10n are connected in the constant current generating circuit blocks 100A to 100N, there is the possibility that the high frequency signals are propagated therethrough so as to leak to the control signal line through the collector to base junction capacitances of the transistors 101 to 10n to cause the crosstalk. In this connection, the crosstalk of the high frequency components increases in quantity because of the capacitive coupling.

As for the measures taken to cope therewith, resistors 501 to 50n have only to be respectively inserted between the collectors of the transistors 101 to 10n in the constant current generating circuit blocks 100A to 100N and the inputs of the corresponding functional circuit blocks 401 to 40n in order to increase the respective impedances. As a result, the crosstalk can be suppressed to a fixed level or less.

In addition, the insertion of the resistors 501 to 50n therebetween offers, in addition to the effect of preventing the leakage of the high frequency signals, the effect of promoting the isolation between the input and the output, and hence contributes to the suppression of the high frequency noises as well as the preventation of the oscillation. As for the resistance values of the inserted resistors 501 to 50n, it is desirable to select the large values as long as the collector voltages are dropped due to the voltage drop resulting from the currents flowing through the resistors and also there is no possibility that each of the transistors 101 to 10n are saturated.

Next, another embodiment of the present invention will hereinbelow be described. That is, in the embodiment shown in FIG. 7, the isolation between the constant current generating circuit blocks 100A to 100N and the corresponding functional circuit blocks 401 to 40n is more effectively attained. Grounded-base transistor amplifiers AMP1 to AMPn are respectively inserted between the collector outputs of the transistors 101 to 10n in the constant current generating circuit blocks 100A to 100N for the channels and the inputs of the corresponding array functional circuit blocks 401 to 40n for the channels which are provided away therefrom.

In such a way, the grounded-base transistor amplifiers AMP1 to AMPn are respectively provided between the constant current generating circuit blocks 100A to 100N and the functional circuit blocks 401 to 40n in order to amplify the respective signals, and also the signals thus amplified are supplied to the corresponding functional circuit blocks 401 to 40n for the channels. As a result, since the output voltages of the collectors of the current generating circuits are stabilized at approximately fixed values, the high frequency isolation between the outputs of the current generating circuits and the inputs of the functional circuit blocks is greatly improved. In addition, in this case, there is also offered the effect that if the collector voltages of the constant current generating circuits are stabilized, then the stability of the output currents of the current generating circuits themselves is increased.

Figure 7:
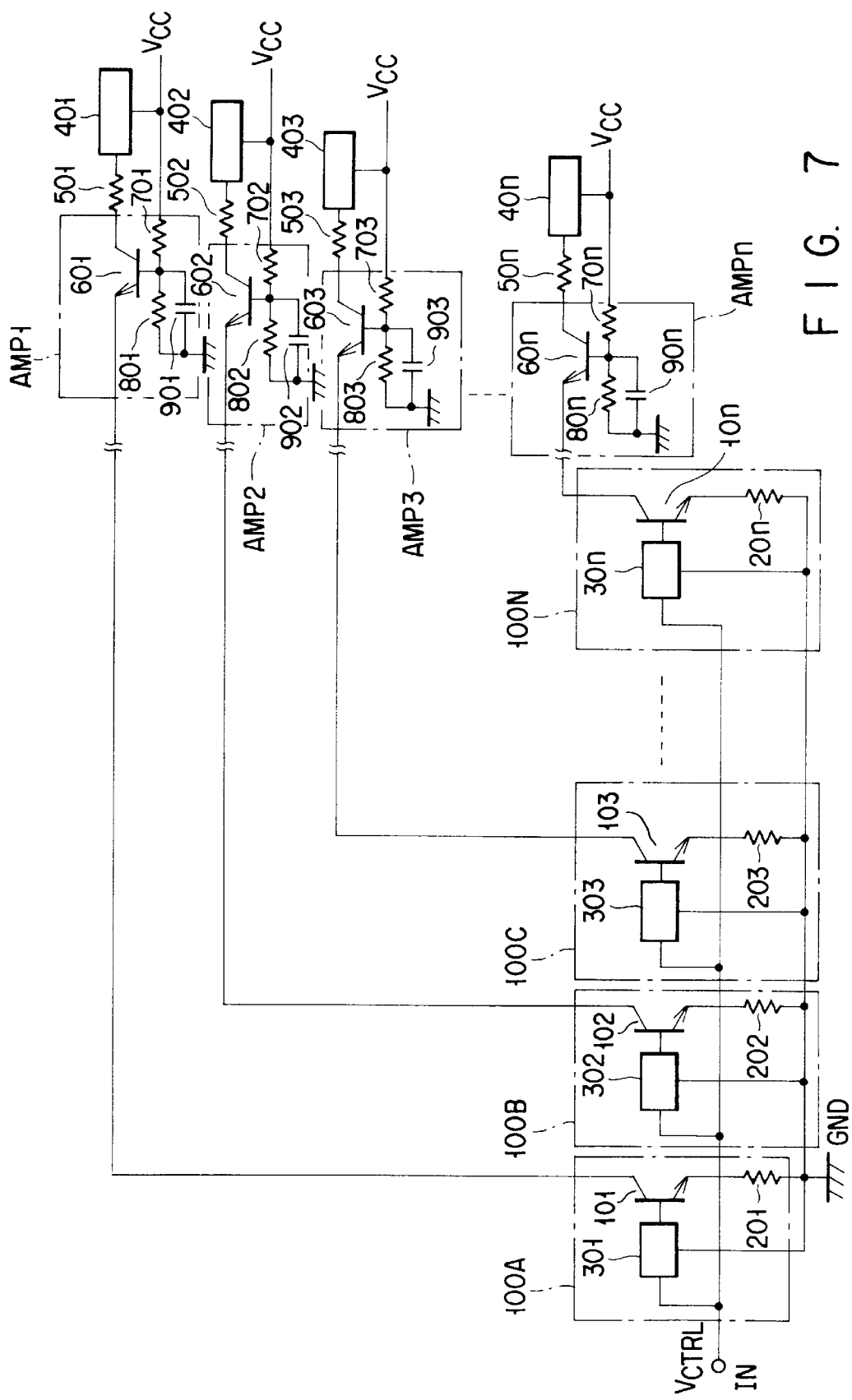
FIG. 7 is a circuit diagram showing a configuration of an array device of another embodiment of the present invention.

In addition, in the circuitry of FIG. 7, there is shown an example which is designed in such a way that for the purpose of further enhancing the effect of the isolation, not only the grounded-base transistor amplifiers AMP1 to AMPn are respectively provided between the constant current generating circuit blocks 100A to 100N and the functional circuit blocks 401 to 40n, but also resistors 501 to 50n are connected in series with the transistor amplifiers AMP1 to AMPn.

Incidentally, as the voltage, of the current generating circuit, for controlling each of the values of the constant currents supplied to the functional circuit blocks 401 to 40n, it is effective to use the voltage of a reference voltage generating circuit which is incorporated on the same chip. More specifically, there can be expected the effects: in the case where the reference voltage generating circuit incorporated on the same chip is employed, the commonness of the ground line is kept, and hence the reference voltage is not influenced by the chip current at all; in the case of the reference voltage generating circuit incorporated on the same chip, since any wiring in the outside of the IC is not required, or even if such wiring is required, the scale of the wiring is small, the influence of the noises is reduced; and since the overall chip is kept at the same temperature, for the change in the ambient air temperature, all the circuits are always subjected to the same temperature change and hence the temperature stability of the generated currents is improved, or it is possible to provide consciously the currents thus generated with the specific temperature characteristics.

A diode is simply used as the means for generating a reference voltage which means is self-contained on the chip since the forward drop voltage thereof is utilized as the reference voltage. In the case of the configuration in which the forward voltage drop of the diode is utilized, since the diode as the constituent element is made of the same material as that of the elements constituting the integrated circuit, if the diode is operated under the same condition as that in the elements of the integrated circuit, the same characteristics can be obtained for the diode at all times. In addition, in principle, the change in the base to emitter voltage of the transistor can be compensated by the voltage developed across one diode. In addition, in the case of the configuration in which the diode is used, since the simple circuitry can be obtained, it is readily made possible that the constant current having the relatively high stability is generated and the current source having the relatively large negative temperature coefficient is configured.

In addition, it was confirmed that in the case where the reference voltage having the very excellent constant voltage characteristics is required, if a band gap reference voltage source (band gap reference circuit) is employed, then the excellent results can be obtained. The band gap reference voltage source is a circuit wherein the temperature coefficient is almost zero and also even if the temperature is changed, the output voltage can be maintained constant. Those characteristics of the band gap reference voltage source are well known. FIGS. 8A and 8B show respectively typical examples of the circuit employing the band gap reference voltage source. The band gap reference voltage source shown in FIG. 8A includes transistors 11, 12, 13 and 14, resistors 21, 22, 23 and 24, and capacitors 31 and 32. In addition, the band gap reference voltage source shown in FIG. 8B includes transistors 11, 12, 13, 14, 15 and 16, resistors 22, 23, 24, 25 and 26, and capacitors 31 and 32.

In the circuit configuration shown in FIG. 8A, for the purpose of simplifying the semiconductor manufacturing process, only the npn transistors are employed as the active devices constituting the band gap reference voltage source circuit, and also the resistor 21 is provided as the current source.

In addition, in the circuit configuration shown in FIG. 8B, for the purpose of improving the stability of the output voltage, the resistor 21 of FIG. 8A is replaced with the constant current source circuit including the pnp transistors 15 and 16, and the resistors 25 and 26.

With respect to the circuits shown in FIGS. 8A and 8B, both the circuit configurations are functionally equal to each other, and hence even when any one of the configurations is employed, by adjusting the circuit constants, the output voltage Vref can be kept constant against the changes in the temperature and the input voltage of the power supply. On the other hand, the resistance values are obtained by making alternations in the optimum value of the constant voltage output, whereby the reference voltage Vref can be made have the positive temperature coefficient or conversely, can be made have the negative temperature coefficient.

The results when applying concretely the circuit modifying and optimizing the band gap reference power source to the laser driving circuit will hereinbelow be described. That is, for the current generating circuit required for the circuit for driving the laser device, there is preferably adopted the method wherein in order to suppress both the change in the optical output and the change in the frequency bandwidth resulting from the temperature change in the lasing threshold and the conversion efficiency of the laser device so as to keep the signal transmission characteristics constant, the driving current is changed in accordance with the operation temperature change so as to compensate therefor.

FIG. 9 shows the results when applying concretely the circuit employing the band gap reference power source to the laser driving circuit. As apparent from FIG. 9, it is possible that the negative output voltage change and the positive output voltage change are obtained against the temperature change. For the current generating circuit which is required for the laser driver circuit, there is preferably adopted the method wherein in order to maintain the signal transmission characteristics constant, the driving current is changed in accordance with the temperature change so as to compensate therefor.

This reason is that the recent laser for the optical interconnection has the lower threshold, and in addition thereto, the temperature characteristics of the threshold and the conversion efficiency have been considerably improved and also the recent laser has the characteristics in which the temperature dependency thereof is changed on the basis of a certain regulation. That is, for the circuit for generating the oscillation threshold and the pulse driving current, instead of the circuit for generating a constant current in such a way as in the prior art, the circuit for changing the output current in accordance with a certain regulation in such a way as to compensate for the temperature characteristics of the semiconductor laser, i.e., the feedforward type circuit is effective.

FIG. 9 is a characteristic view showing the temperature dependency of the control voltage to be inputted with the various output current values as parameters in an actual application example, wherein for the ideal values represented by points (circles, squares and triangles), when employing the reference voltage generating circuit shown in FIG. 8A or 8B, the characteristics represented by the solid lines are obtained by only adjusting the resistance value of the resistor 22 while fixing other constants.

As apparent from the figure, the reference voltage is obtained in which the temperature coefficient ranges from the positive range to the negative range and also the absolute values thereof matching each other can be generated with high accuracy. As a result, the output intensity of the semiconductor laser has a fixed value irrespective of the temperature.

Incidentally, in the configuration, shown in FIG. 3, as the conventional configuration example, the active circuits or the low-pass filter circuits are respectively provided in the base input portions of the transistors in the constant current generating circuits 100A' to 100N'. However, since a plurality of constant current generating circuits are distributively arranged on the same chip, the slight voltage differences occur between the ground line voltages of the circuits and hence any ground line voltage can not be necessarily regarded as the common grounding voltage. But, in this case as well, while the provision of the filter offers the offset of suppressing the high frequency random noises, it is not effective to the suppression of the noises, as the crosstalk between the channels, since the filter is not provided in the current path.

In the case of the embodiments of the present invention shown in FIGS. 5 and 7, there is adopted the configuration in which a plurality of current generating circuits are locally, concentratedly on the chip, and therefore, the commonness of the grounding is excellent, and in addition thereto, the commonness of the voltages used to control the generated currents to the ground point level is also excellent. Therefore, since the grounding of the filters which are inserted between the control line and the bases of the current generating transistors forms the same common line, the filter suppression effect offered by the low-pass filters against the high frequency signals is enormous.

For this reason, most of the crosstalks lying in the high frequency region are attenuated through the low-pass filters thus inserted, which results in the isolation between the channels being able to be enhanced.

Next, another embodiment of the present invention will hereinbelow be described with reference to FIG. 10. That is, in FIG. 10, the input terminal IN for the control signal voltage VCTRL is provided on a chip 1A. The chip 1A is provided with current generating circuit blocks 1000A to 1000N for the channels and functional circuit blocks 4001 to 400n for the channels.

The current generating circuit blocks 1000A to 1000N for the channels receive the control signal voltage VCTRL which has been inputted through the input terminal IN to generate respective current outputs having desired current values and then supply the currents thus generated to the corresponding functional circuit blocks 4001 to 400n of the channels. The functional circuit blocks 4001 to 400n for the channels are operated in accordance with the currents thus supplied thereto.

The current generating circuit blocks 1000A to 1000N include transistors 1001, and 1002 to 100n, input resistors 9001, and 9002 to 900n, input circuits 3001, and 3002 to 300n, and emitter resistors 2001, and 2002 to 200n, respectively, and generate currents in accordance with the control signal voltage VCTRL which has been inputted through the input terminal IN in order to supply the currents thus generated to the corresponding functional circuit blocks 4001 to 400n, respectively.

In the device of the present invention, though the control signal voltage VCTRL is distributed from the input terminal IN through which the control signal voltage VCTRL is inputted to a plurality of current generating circuit blocks 1000A to 1000N through the respective control signal wirings, the current generating circuit blocks 1000A to 1000N are arranged in the vicinities of the functional circuit blocks 4001 to 400n, respectively, and also the combined circuit blocks are arranged on the chip so as to be distributed. thereon on the basis of a certain regulation. The current generating circuit blocks 1000A to 1000N include grounded-emitter npn transistors 1001 to 100n, respectively. Then, the control signal voltage VCTRL is supplied to the bases of the transistors 1001 to 100n, respectively, so that the transistors 1001 to 100n generate, in response to the control signal voltage thus supplied thereto, the currents in order to supply the currents to the corresponding functional circuit blocks 4001 to 400n.

In addition, the control signal voltage VCTRL is supplied to the bases of the transistors in the current generating circuit blocks 1000A to 1000N through the respective resistors 9001 to 900n which have different resistance values corresponding to the circuit blocks. The resistance values of the resistors 9001 to 900n which are connected to the bases of the transistors 1001 to 100n are selected in such a way that the differences between the voltage drops which are respectively developed across the resistors 9001 to 900n due to the base currents and the offset voltages in the grounding line to which the emitter resistors 2001 to 200n in the transistors 1001 to 100n are respectively connected match each other.

Next, the description will hereinbelow be given with respect to the operation of the present device having the above-mentioned configuration. That is, in the present invention shown in FIG. 10, though a plurality of current generating circuit blocks 1000A to 1000N are distributively arranged and the control signal voltage VCTRL is distributed from the input terminal IN to a plurality of current generating circuit blocks 1000A to 1000N through the respective control signal wirings, the current generating circuit blocks 1000A to 1000N are respectively arranged in the vicinities of the functional circuit blocks 4001 to 100n, and also the combined circuit blocks are arranged on the chip so as to be distributed thereon on the basis of the fixed regulation. Therefore, the resistance values of the grounding wirings between the channels can be quantitatively grasped.

In addition, it is also different from the above-mentioned embodiment that the control signal voltage VCTRL is supplied to the bases of the transistors in the current generating circuit blocks 1000A to 1000N through the resistors which have the respective resistance values corresponding to the circuit blocks. In this connection, the differences between the resistors 9001 to 900n which are respectively connected to the bases of the transistors 1001 to 100n are selected in such a way that the differences between the voltage drops which are developed across the resistors due to the base currents and the offset voltage differences between the reference ground point of the integrated circuit and the ground to which the emitter resistors are connected are substantially equal to one another.

As for a concrete example, the description will hereinbelow be given with respect to a configuration example in which the circuit blocks as shown in FIG. 11 are arranged in the form of one-dimensional array at fixed pitches. The circuit shown in FIG. 11 is an example in which while the current generating circuit blocks 1000A to 1000N are respectively connected to the ground line for exhibiting the ground electric potential, since the ground line is the wiring and hence has its wiring resistance, the ground wiring resistor having the resistance value of 20r is present between the adjacent current generating circuit blocks two by two in the current generating circuit blocks 1000A to 1000N, and the wiring resistor having the resistance value of 30r and the wiring resistor having the resistance value of 10r are respectively present between the channel ch1 and the main ground and between the channel chn (=ch12) and the main ground.

All the currents which are caused to flow from the circuit blocks into the ground wiring are identical to one another except that in only the control circuit block, the current branches so as to be caused to flow from the halves thereof into the right and left ground wirings. In addition, this is also applied to the currents flowing into the bases of the transistors in the current sources.

Under this condition, the offset voltage differences occurring in the grounding portions between the adjacent circuit blocks two by two have the ratio relationship of 11:9:7:5:3:1 in the direction from the center circuit block, out of the circuit blocks for a plurality of channels arranged on the chip, towards the end circuit block. Therefore, the resistance value of the resistor which is connected to the base of the transistor in the center circuit block may be suitably determined, and also the differences between the resistance values of the resistors which are connected to the bases of the transistors in the circuit blocks adjacent to each other may be determined so as to have the ratio relationship of 1:3:5:7:9:11 in the reverse order. Incidentally, the concrete proportional coefficients are determined on the basis of the resistance values of the ground wiring, the values of the currents flowing through the functional circuits, and the base currents.

As a result, all the resistance values of the emitter resistors in the current sources, i.e., all the voltages which are applied to the emitter resistors in the transistors of the current generating circuit blocks for the channels are made equal to one another, and hence all the currents which are outputted from all the constant current generating circuits have the same value.

Figure 12:
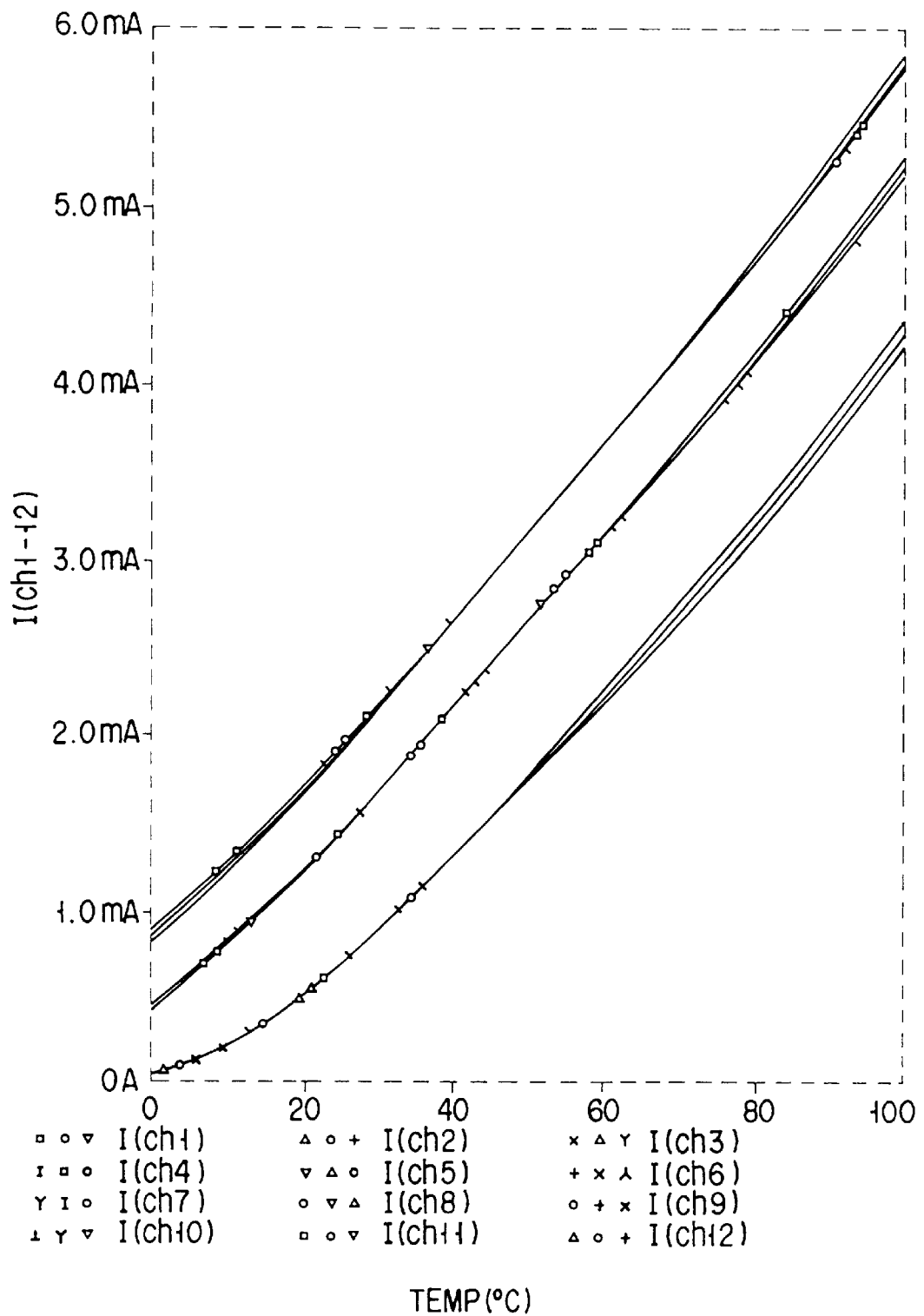
FIG. 12 is a graphical representation showing the temperature dependency of a bias current in a feed-forward type DC bias current generating circuit.

FIG. 12 shows the operation results in the case where the device is designed in such a way that instead of inputting directly the control voltage to the bases of the transistors of the current sources through the resistors, the control signal voltage is inputted to the bases of the transistors of the current sources through the resistors and the emitter-followers, whereby the voltage drops developed across the resistors are stabilized and also the temperature dependency of the output current is increased. It can be confirmed from FIG. 12 that for the three kinds of different output current values, the outputs for the 12 channels match approximately each other in the wide temperature range.

Figure 10:
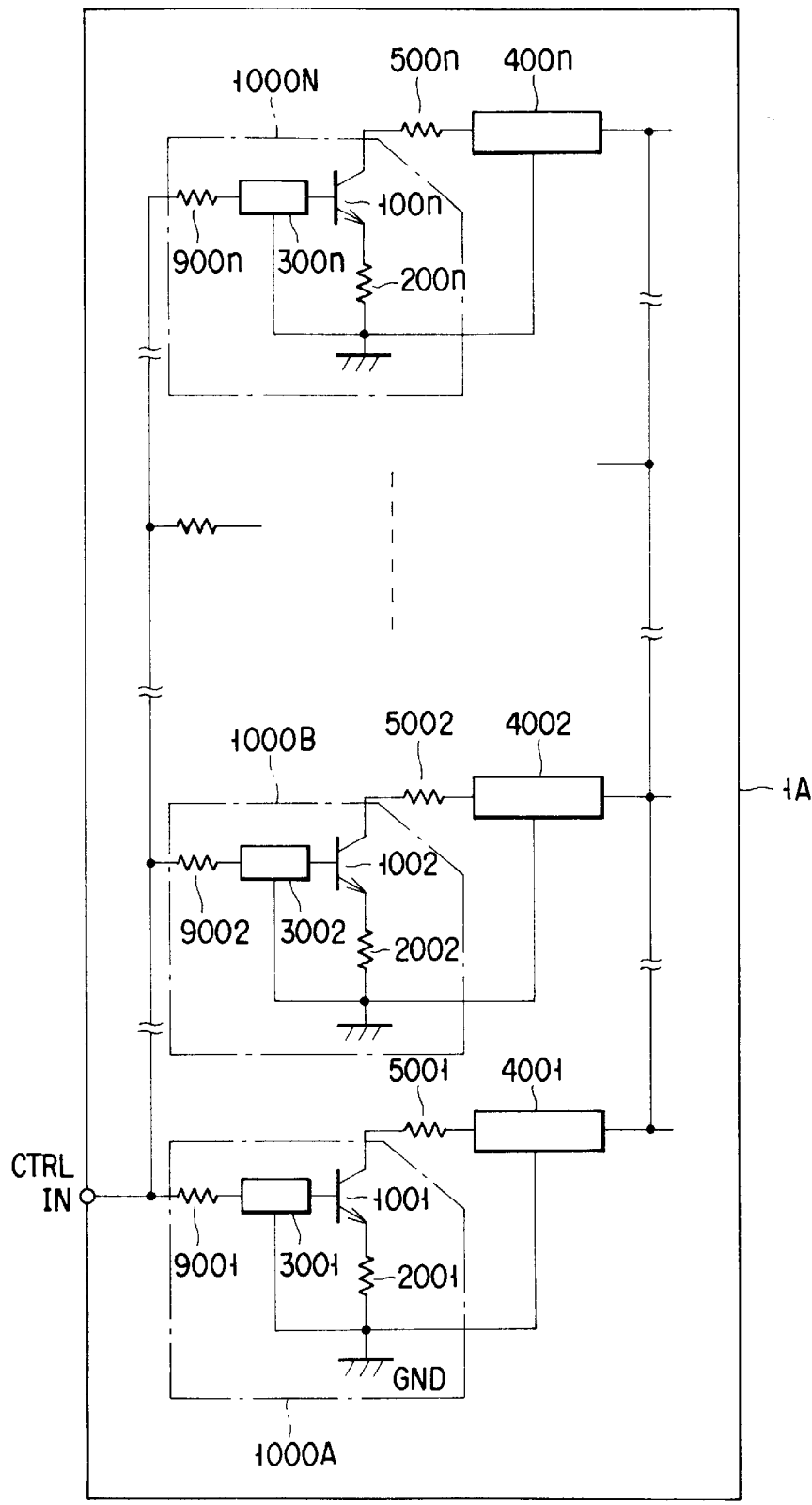
FIG. 10 is a circuit diagram showing a configuration of an array device of still another embodiment of the present invention.

In the configuration shown in FIG. 10, the current output from the collector of the transistor in the current source is connected to the current input of the corresponding functional circuit block. In such a configuration, however, there is the possibility that when the high frequency signal is provided on the output of the functional circuit block to which the collector output is connected, conversely, the high frequency signal is propagated to the collector so as to leak onto the control signal line through the collector to base junction capacitance which the transistor 1001 (or 1002, . . . , 100*n*) has to generate the crosstalk. In this case, the crosstalk of the high frequency components is increased because of the capacitive coupling.

In this connection, a resistor 5001 (or 5002, 500*n*) is inserted between the collector of the transistor 1001 (or 1002, . . . , 100*n*) and the input of the functional circuit block 4001 (or 4002, . . . , 400*n*) in order to increase the impedance, whereby the crosstalk can be suppressed to a fixed level or less.

In addition, this insertion of the resistor offers, in addition to the effect of preventing the leakage of the high frequency components, the effect of attaining the isolation between the input and the output and also contributes to the suppression of the high frequency noises as well as the suppression of the oscillation.

As for the resistance value of the resistor 5001 (or 5002, . . . , 500*n*) thus inserted, the large value is selected as long as the collector voltage of the transistor 1001 (or 1002, . . . , 100*n*) is dropped by the voltage drop which is developed across the resistor 5001 (or 5002, . . . , 500*n*) due to the current flowing therethrough and hence the transistor may not be saturated.

Next, the description will hereinbelow be given with respect to another example in which the isolation of the high frequency components between the collectors of the transistors 1001 to 100*n* and the inputs of the functional circuit blocks 4001 to 400*n* is attained. A circuitry shown in FIG. 13 is an example in which the isolation between the constant current generating circuits and the functional circuit blocks is attained. The circuitry shown in FIG. 13 is designed in such a way that grounded-base transistor amplifiers 6001 (6002, . . . , 600*n*) are respectively inserted between the collector outputs of the transistors 6001 to 600*n* in the current generating circuit blocks 1000A to 1000N for the channels and the inputs of the array functional circuit blocks 4001 to 400*n* having the corresponding channels in the current generating circuit blocks 1000A to 1000N.

By adopting this configuration, since the output voltages of the current generating circuit blocks 1000A to 1000N are stabilized at the approximately constant value by the amplification function of the grounded-base transistor amplifiers 6001 (6002, . . . , 600*n*) which are cascade-connected, the high frequency isolation between the outputs of the current generating circuits and the inputs of the functional circuit blocks can be greatly improved.

In addition, in this case, there is also offered the effect that the stabilization of the collector voltages of the constant current circuits by provision of the transistor amplifiers 6001 (6002, . . . , 600*n*) results in the stability of the output currents of the current generating circuits themselves being improved.

Furthermore, for the purpose of further enhancing the isolation effect, the circuitry shown in FIG. 13 follows the configuration shown in FIG. 10, in which the resistor 5001 (or 5002, . . . , 500*n*) is connected in series with the input of the functional circuit block 4001 (or 4002, . . . , 400*n*), as it is. As a result, the impedance is increased, thereby suppressing the crosstalk of the high frequency components to a fixed level or less.

Incidentally, as the voltage for the current generating circuit for controlling the constant currents which are supplied to the functional circuit blocks, respectively, it is effective to use the voltage from the reference voltage generating circuit which is incorporated on the same chip. This reason is that: since the ground line is distributed within the chip and hence its length is small, the influence of the chip current of the reference voltage is reduced; since no wiring is distributed in the outside of the IC and even if such a wiring is required, the scale of the wiring distribution is small, the influence of the noises is reduced; and since the overall chip is kept at the same temperature, for the change in the ambient air temperature, all the circuits are always subjected to the same temperature change and hence the temperature stability of the generated currents is improved, or it is possible to provide consciously the currents thus generated with the specific temperature characteristics.

A diode is simply used as the means for generating a reference voltage which means is self-contained on the chip since the forward drop voltage thereof is utilized as the reference voltage. In the case of the configuration in which the forward drop voltage of the diode is utilized as the reference voltage, since the diode as the constituent element is made of the same material as that of the elements constituting the integrated circuit, if the diode is operated under the same condition as that in the elements of the integrated circuit, the same characteristics can be obtained for the diode at all times. In addition, in principle, the change in the base to emitter voltage of the transistor can be compensated by the voltage developed across one diode, and hence the simple circuitry can be obtained.

By adopting that configuration, though the circuitry is simple in the configuration, it is made possible that the constant current having the relatively high stability is generated and the current source having the relatively large negative temperature coefficient is configured.

When there is required the reference voltage having the very excellent constant voltage characteristics, if the band gap reference voltage source (the band gap reference circuit) shown in FIG. 8A or 8B is employed, the good results can be obtained. The circuit employing the band gap reference voltage source can be concretely applied to the laser driving circuit. For the current generating circuit which is required for the circuit for driving the laser, there is preferably adopted the method wherein in order to suppress both the change in the optical output and the change in the frequency bandwidth resulting from the temperature change in the oscillation threshold and the conversion efficiency of the laser so as to maintain the signal transmission characteristics constant, the driving current is changed in accordance with the temperature change so as to compensate therefor.

This reason is that the recent laser device for the optical interconnection has the lower threshold, and in addition thereto, the temperature characteristics of the threshold and the conversion efficiency have been considerably improved and also the recent laser has the characteristics in which the temperature dependency thereof is changed on the basis of a certain regulation. That is, for the circuit for generating the lasing threshold and the pulse driving current, instead of the circuit for generating a constant current in such a way as in the prior art, the circuit for changing the output current in accordance with a certain regulation in such a way as to compensate for the temperature characteristics of the semiconductor laser, i.e., the feedforward type circuit is effective. For the actual application example, the temperature dependency of the control voltage which is to be inputted with the various output current values as parameters is just as we showed in FIG. 9. As apparent from FIG. 9, the reference voltage is obtained in which the temperature coefficient ranging from the positive range to the negative range and also the absolute values thereof matching each other can be generated with high accuracy. As a result, the input intensity of the semiconductor laser has a fixed value irrespective of the temperature.

In the configuration as well, shown in FIG. 6, as the conventional configuration example, the active circuits or the low-pass filter circuits are respectively provided in the base input portions of the constant current generating circuits. In this case, however, since a plurality of constant current generating circuits are distributed arranged on the same chip, the slight voltage differences occur between the ground line voltages of the circuits and hence any ground line voltage can not be necessarily regarded as the common ground voltage. But, in this case as well, while the provision of the filter offers the effect of suppressing the high frequency random noises, it is not effective to the suppression of the noises, as the crosstalk between the channels, since the filter is not provided in the current path.

In the case of the embodiment as well according to the present invention, since a plurality of current generating circuits are distributed arranged on the same chip in the same manner as that in the prior art, the effect offered by provision of the filter does not differ from that of the prior art example so much. But, since the commonness of the grounding of the current sources and the functional circuit blocks is excellent, which effectively affects the signal leaking from the functional circuit via the associated current source, it is useful to suppress the crosstalk via the control line.

For this reason, most of the crosstalks of components in the high frequency region are attenuated through the low-pass filters thus inserted, which results in the isolation between the channels being able to be enhanced.

While the description has been given by taking the bipolar transistor as an example, the present invention is not limited to the bipolar transistor. For example, the present invention is also applied to an active device such as a junction FET, a MOSFET, a GaAs MESFET, an HBT or a HEMT.

As set forth hereinabove, according to the present invention, since only one connection which is common to the array circuits is required for the power supply, the ground line and the control signal, the increase in the number of terminals necessary for the optical interconnect module package is suppressed so that the module configuration is simplified, and hence both the miniaturization and the promotion of low cost are made possible. In addition, when using the optical interconnect modules, the setting current values of all the channels can be adjusted to the same value by only adjusting one portion, and hence the convenience for use is improved. These effects contribute necessarily to the promotion of low cost at the system level.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An array device comprising:

an integrated circuit chip having first and second formation areas;

an input terminal provided in the vicinity of the second formation area;

functional circuits for a plurality of channels, provided so as to form an array in the first formation area;

a constant current generating section having constant current generating circuits for the plurality of channels, the constant current generating circuits being collectively arranged in the second formation area so as to correspond to the channels of the functional circuits, respectively, and for generating constant currents used to drive the functional circuits, respectively, in accordance with a control signal supplied from the input terminal; and a wiring section having at least one of common ground wirings and control wirings, for supplying therethrough the constant currents from the constant current generating circuits to the functional circuits, respectively, the common ground wirings being provided in the vicinity of the constant current generating circuits and connecting the constant current generating circuits, and the control wirings being formed between the first and second formation areas and connecting the functional circuits and the constant current generating circuits, respectively, wherein the control wirings have a resistance so as to reduce crosstalk, each of the constant current generating circuits includes a grounded-emitter transistor, and an input resistor connected to a base of the transistor, and an emitter resistor connected to an emitter of the transistor, and the resistance value of the input resistor is set in such a way that the voltage drop developed across the input resistor due to a base current of the transistor flowing through the input resistor matches the offset voltage of the ground line to which the emitter resistor is connected.

2. An array device comprising:

an integrated circuit chip having first and second formation areas;

an input terminal provided in the vicinity of the second formation area;

functional circuits for a plurality of channels, provided so as to form an array arranged in the first formation area;

a constant current generating section having constant current generating circuits for the plurality of channels, the constant current generating circuits being collectively arranged in the second formation area so as to correspond to the channels of the functional circuits, respectively, and for generating constant currents used to drive the functional circuits, respectively, in accordance with a control signal supplied from the input terminal; and a wiring section having at least one of common ground wirings and control wirings, for supplying therethrough the constant currents from the constant current generating circuits to the functional circuits, respectively, the common grounds wiring being provided in the vicinity of the constant current generating circuits and connecting the constant current generating circuits, and the control wirings being formed between the first and second formation areas and connecting the functional circuits and the constant current generating circuits, respectively, wherein the control wirings have resistance so as to reduce crosstalk.

3. An array device comprising:

an integrated circuit chip having first and second formation areas;

an input terminal provided in the vicinity of the second formation area;

functional circuits for a plurality of channels, provided so as to form an array in the first formation area;

a constant current generating section having constant current generating circuits for the plurality of channels, the constant current generating circuits being collectively arranged in the second formation area so as to correspond to the channels of the functional circuits, respectively, and for generating constant currents used to drive the functional circuits, respectively, in accordance with a control signal supplied from the input terminal; and a wiring section having at least one of common ground wirings and control wirings, for supplying therethrough the constant currents from the constant current generating circuits to the functional circuits, respectively, the common ground wirings being provided in the vicinity of the constant current generating circuits and connecting the constant current generating circuits, and the control wirings being formed between the first and second formation areas and connecting the functional circuits and the constant current generating circuits, respectively, each of the constant current generating circuits includes a grounded-emitter transistor, and an input resistor connected to a base of the transistor, and an emitter resistor connected to an emitter of the transistor, and the resistance value of the input resistor is set in such a way that the voltage drop developed across the input resistor due to a base current of the transistor flowing through the input resistor matches the offset voltage of the ground line to which the emitter resistor is connected.

4. An array device according to claim 2, wherein each of said constant current generating circuits includes a grounded-emitter transistor which receives the control signal as a base driving input.

5. An array device according to claim 2, wherein each of said constant current generating circuits includes:

an input circuit having an input terminal for receiving therethrough the control signal; and a grounded-emitter transistor having a base to which an output terminal of said input circuit is connected and a collector connected to the associated functional circuit.

6. An array device according to claim 5, wherein said input circuit includes an active circuit.

7. An array device according to claim 5, wherein said input circuit includes a low-pass filter.

8. An array device according to claim 2, wherein each of said functional circuits includes a circuit for driving a laser beam emitted from a semiconductor laser device.

9. An array device according to claim 2, further comprising a reference voltage generating circuit arranged on said integrated circuit chip for supplying a reference voltage as the control signal to said constant current generating circuits.

10. An array device according to claim 9, wherein said reference voltage generating circuit includes a band gap constant voltage source.

11. An array device according to claim 9, wherein said reference voltage generating circuit includes an internal reference voltage generating source, and said internal reference voltage generating source corresponds to a forward drop voltage of a diode so as to provide a value of an outputted current with a specific temperature coefficient.

12. An array device according to claim 9, wherein said reference voltage generating circuit includes a circuit for outputting a voltage having a specific temperature coefficient.

13. An array device according to claim 10, wherein said band gap constant voltage source has a positive/negative temperature coefficient.

14. An array device according to claim 2, further comprising resistors connected between said constant current generating circuits and said functional circuits.

15. An array device according to claim 2, further comprising grounded-base transistor amplifiers connected between said constant current generating circuits and said functional circuits.

16. An array device according to claim 1, further comprising resistors and grounded-base transistor amplifiers connected between said constant current generating circuits and said functional circuits.

17. An array device according to claim 3, wherein said constant current generating circuits provided so as to correspond to the channels are arranged distributively in the vicinities of said functional circuits within said integrated circuit chip.

18. An array device according to claim 3, wherein the resistance values of the emitter resistors in said constant current generating circuits are set to the same value.

19. An array device according to claim 3, further comprising input circuits connected between the input resistors of said constant current generating circuits and bases of the transistors.

20. An array device according to claim 19, wherein the input circuit includes an active circuit and/or a band-pass filter.

21. An array device according to claim 3, wherein each of said functional circuits includes a circuit for transmitting/receiving a laser beam emitted from a semiconductor laser device.

22. An array device according to claim 3, further comprising a reference voltage generating circuit arranged on said integrated circuit chip for supplying a reference voltage as the control signal to said constant current generating circuits.

23. An array device according to claim 22, wherein said reference voltage generating circuit includes a band gap constant voltage source.

24. An array device according to claim 22, wherein said reference voltage generating circuit includes an internal reference voltage generating source, and said internal reference voltage generating source corresponds to a forward drop voltage of a diode so as to provide a value of an outputted current with a specific temperature coefficient.

25. An array device according to claim 22, wherein said reference voltage generating circuit includes a circuit for outputting a voltage having a specific temperature coefficient.

26. An array device according to claim 3, wherein said band gap constant voltage source has a positive/negative temperature coefficient.

27. An array device according to claim 3, further comprising circuits which are respectively connected between said constant current generating circuits and said functional circuits and each of which is comprised of a resistor and/or a grounded-base transistor amplifier.

* * * * *

UNITED STATES PATENT AND TRADEMARK OFFICE
CERTIFICATE OF CORRECTION

PATENT NO. : 5,883,546
DATED : March 16, 1999
INVENTOR(S) : Katsuji Kaminishi et al.

It is certified that error appears in the above-indentified patent and that said Letters Patent is hereby corrected as shown below:

Claim 2, Column 17, line 34, "grounds wiring" should read --ground wirings--.

Claim 2, Column 17, line 41, before "resistance", insert --a--.

Claim 16, Column 18, line 59, "claim 1" should read --claim 2--.

Signed and Sealed this

Sixteenth Day of November, 1999

Attest:

Q. TODD DICKINSON

*Attesting Officer*  *Acting Commissioner of Patents and Trademarks*